(12) United States Patent
Chen et al.

(10) Patent No.: US 9,136,170 B2
(45) Date of Patent: Sep. 15, 2015

(54) THROUGH SILICON VIA (TSV) STRUCTURE AND PROCESS THEREOF

(75) Inventors: Jia-Jia Chen, Taichung (TW); Chi-Mao Hsu, Tainan (TW); Tsun-Min Cheng, Changhua County (TW); Chun-Ling Lin, Tainan (TW); Huei-Ru Tsai, Kaohsiung (TW); Ching-Wei Hsu, Changhua County (TW); Chin-Fu Lin, Tainan (TW); Hsin-Yu Chen, Nantou County (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 433 days.

(21) Appl. No.: 13/483,074

(22) Filed: May 30, 2012

(65) Prior Publication Data

US 2013/0320537 A1    Dec. 5, 2013

(51) Int. Cl.
*H01L 23/48* (2006.01)
*H01L 21/768* (2006.01)

(52) U.S. Cl.
CPC ... *H01L 21/76898* (2013.01); *H01L 2924/0002* (2013.01)

(58) Field of Classification Search
CPC ....................................................... H01L 23/48
USPC ................... 257/751, 731, E23.011, E21.499
See application file for complete search history.

(56) References Cited

U.S. PATENT DOCUMENTS

| | | |
|---|---|---|
| 5,563,096 A | 10/1996 | Nasr |
| 5,847,421 A | 12/1998 | Yamaguchi |
| 5,950,090 A | 9/1999 | Chen |
| 6,171,436 B1 | 1/2001 | Huynh |
| 6,372,605 B1 | 4/2002 | Kuehne |
| 6,664,190 B2 | 12/2003 | Chen |
| 7,166,506 B2 | 1/2007 | Prince |
| 7,195,535 B1 | 3/2007 | Swedek |
| 7,196,010 B2 | 3/2007 | Park |
| 7,399,437 B2 | 7/2008 | James |
| 7,687,393 B2 | 3/2010 | Iwasa |
| 2003/0166338 A1 | 9/2003 | Ahn |
| 2006/0251800 A1* | 11/2006 | Weidman et al. ............ 427/99.5 |
| 2008/0280432 A1 | 11/2008 | Chang |
| 2010/0237502 A1* | 9/2010 | Yu et al. ........................ 257/751 |
| 2011/0014773 A1 | 1/2011 | Lin |
| 2011/0227227 A1* | 9/2011 | West .............................. 257/757 |

* cited by examiner

*Primary Examiner* — Samuel Gebremariam
(74) *Attorney, Agent, or Firm* — Winston Hsu; Scott Margo

(57) ABSTRACT

A through silicon via structure is located in a recess of a substrate. The through silicon via structure includes a barrier layer, a buffer layer and a conductive layer. The barrier layer covers a surface of the recess. The buffer layer covers the barrier layer. The conductive layer is located on the buffer layer and fills the recess, wherein the contact surface between the conductive layer and the buffer layer is smoother than the contact surface between the buffer layer and the barrier layer. Moreover, a through silicon via process forming said through silicon via structure is also provided.

8 Claims, 5 Drawing Sheets

THROUGH SILICON VIA (TSV) STRUCTURE AND PROCESS THEREOF

BACKGROUND OF THE INVENTION

1. Field of the Invention

The present invention relates generally to a through silicon via structure and a process thereof, and more specifically to a through silicon via structure and a process thereof that forms a buffer layer between a barrier layer and a conductive layer.

2. Description of the Prior Art

The through-silicon via technique is quite a novel semiconductor technique. The through-silicon via technique advantage mainly resides in solving the problem of the electrical interconnection of chips and the TSV belongs to a new 3D packing technique field. The hot through-silicon via technique creates products that fit better the market trends of "light, thin, short and small" through through-silicon via 3D stacking, to provide the micro electronic mechanic system (MEMS), the photoelectronics and electronic elements with packing techniques of wafer-level package.

The through-silicon via technique drills holes in the wafer through etching or using laser then fills the holes with conductive materials such as copper, polysilicon or tungsten to form vias, i.e. conductive channels connecting inner regions and outer regions. Finally, the wafer or the dice is thinned to be stacked or bonded together to be a 3D stack IC. In this way, the wire bonding procedure may be omitted. Using etching or laser techniques to form conductive vias not only avoids the wire bonding step but also reduce the occupied area on the circuit board and the volume to be packed.

The inner connection distance of the package of the 3D stack IC with the through-silicon via technique, i.e. the thickness of the thinned wafer or the dice, is much shorter compared to the conventional stack package of wire bonding type, so the 3D stack IC performs better in many ways, for it has smaller electrical resistance, faster transmission, lower noise and better performances. For the CPUs, flash memories and memory cards especially, the advantages of the shorter inner connection distance of the through-silicon via technique are much more outstanding. In addition, the package size of the 3D stack IC equals to the size of the dice, so the through-silicon via technique is more valuable in portable electronic devices.

However, a via of the through-silicon via structure in the wafer formed through etching has a high depth/width ratio, and the depth/diameter ratio of the via can approach 10 times. But a via having a high depth/width ratio formed through etching raise the problem of rough surface of the via. For example, the surface of the via has a scallop cross-sectional profile. The rough surface of the via leads to material layers, such as a seed layer formed thereon, to have a rough surface as well, which degrades the efficiency of the step coverage of the material layers.

SUMMARY OF THE INVENTION

The present invention provides a through silicon via structure and a process thereof that forms a buffer layer between a barrier layer and a conductive layer so that said problem of rough surface can be solved, and enhances the electrical performances of the through silicon via structure.

The present invention provides a through silicon via structure located in a recess of a substrate, and the through silicon via structure includes a barrier layer, a buffer layer and a conductive layer. The barrier layer covers the surface of the recess. The buffer layer covers the barrier layer. The conductive layer is located on the buffer layer and fills the recess, wherein the contact surface between the conductive layer and the buffer layer is smoother than the contact surface between the barrier layer and the buffer layer.

The present invention provides a through silicon via process including the following steps. A recess is formed in a substrate. A barrier layer is formed to cover the surface of the recess. A buffer layer is formed to cover the barrier layer. A conductive layer is formed on the buffer layer and fills the recess, wherein the contact surface between the conductive layer and the buffer layer is smoother than the contact surface between the barrier layer and the buffer layer.

According to the above, the present invention provides a through silicon via structure and a process thereof, which forms the buffer layer between the barrier layer and the conductive layer, so that problems of rough surface of the material layers such as the seed layer formed on the rough surface of the recess can be solved. In other words, the contact surface between the conductive layer and the buffer layer is smoother than the contact surface between the barrier layer and buffer layer. Moreover, the buffer layer of the present invention provides the seed layer a better adhesivity, so that the thickness of the seed layer can be reduced, and the processing time and cost are therefore reduced. Thus, the remaining opening size of the recess increases, which enables the main conductive layer to be easier to fill into the recess, and prevents the generation of voids. Furthermore, the through silicon via structure formed by the buffer layer of the present invention is more thermal resistive and thermal cracks generation is avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
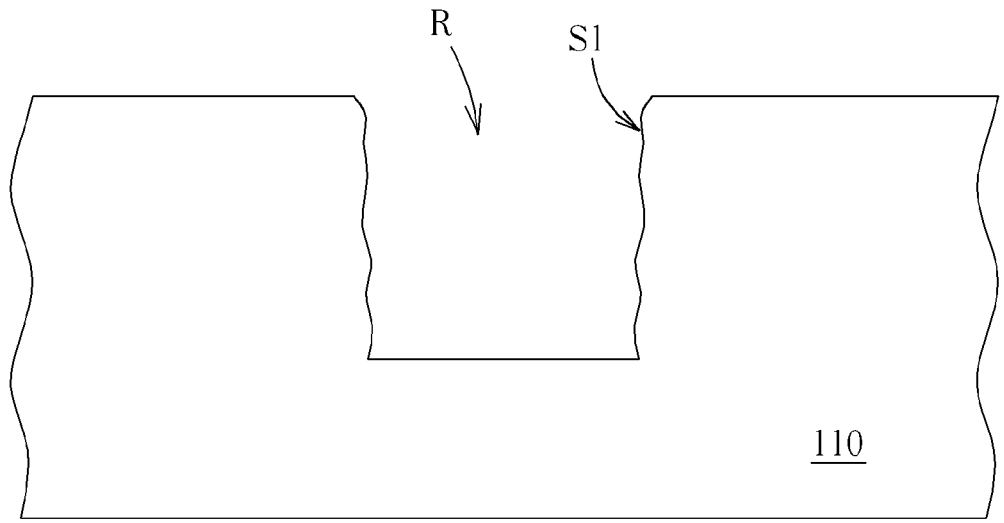
FIGS. 1-5 schematically depict cross-sectional views of a through silicon via process according to an embodiment of the present invention.

FIGS. 1-5 schematically depict cross-sectional views of a through silicon via process according to an embodiment of the present invention. As shown in FIG. 1, a substrate 110 having a recess R is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. The recess R has a high depth/width ratio for forming a through silicon via structure. Generally, the recess R is formed by etching and the depth/diameter ratio is larger than 10, but it is not limited thereto.

The methods of forming the recess R in the substrate 110 may include the following steps. A hard mask (not shown) is formed on the substrate. The hard mask (not shown) may include a pad oxide layer (not shown) and a pad nitride layer (not shown) or etc. The hard mask (not shown) is patterned to form a patterned hard mask (not shown), and then the patterns of the patterned hard mask (not shown) is transferred to the substrate 110 by methods such as etching, meaning the recess R is formed in the substrate 110.

Due to the recess R having a high depth/width ratio, the surface of the recess R has a rough surface S1 with a scallop cross-sectional profile as shown in the figure. The rough surface S1 leads to material layers (such as a barrier layer and a seed layer or etc) formed thereon in latter processes to also have rough surfaces, thereby degrading the processing qualities of the step coverage of the material layers.

Figure 2:
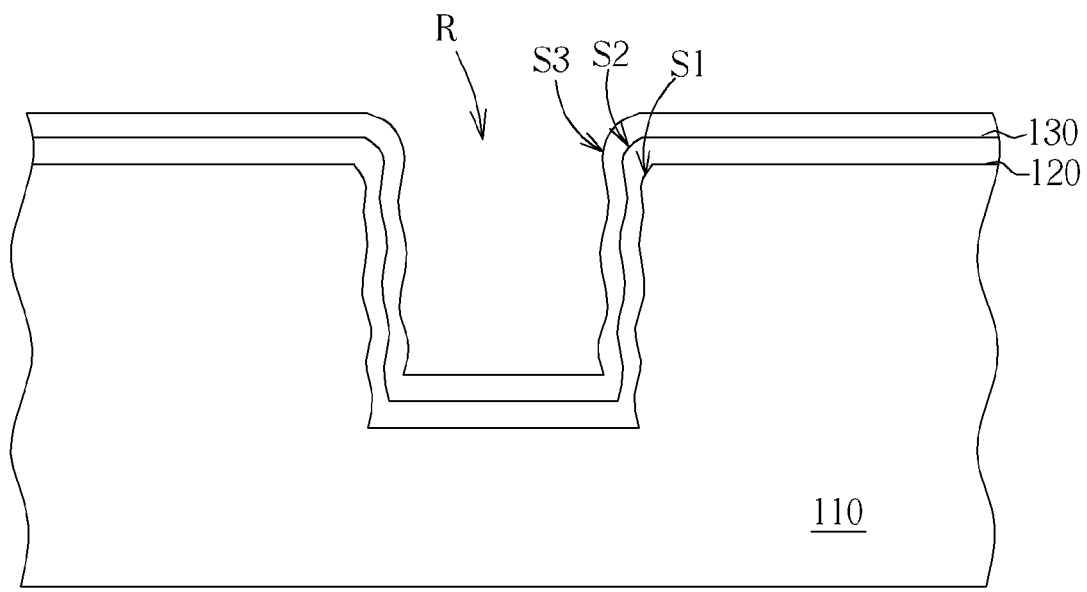

As shown in FIG. 2, a liner 120 may be selectively formed to conformally cover the substrate 110, and to especially cover the rough surface S1 of the recess R. The liner 120 may be an oxide layer to electrically isolate the substrate 110, but it is not limited thereto. A barrier layer 130 is formed on the liner 120. The barrier layer 130 may include a single or multilayer structure composed of a titanium nitride layer or a tantalum nitride layer etc. As shown in the figure, due to the rough surface S1 of the substrate 110, the surfaces S2 and S3 of the liner 120 and the barrier layer 130 are also rough.

Figure 3:
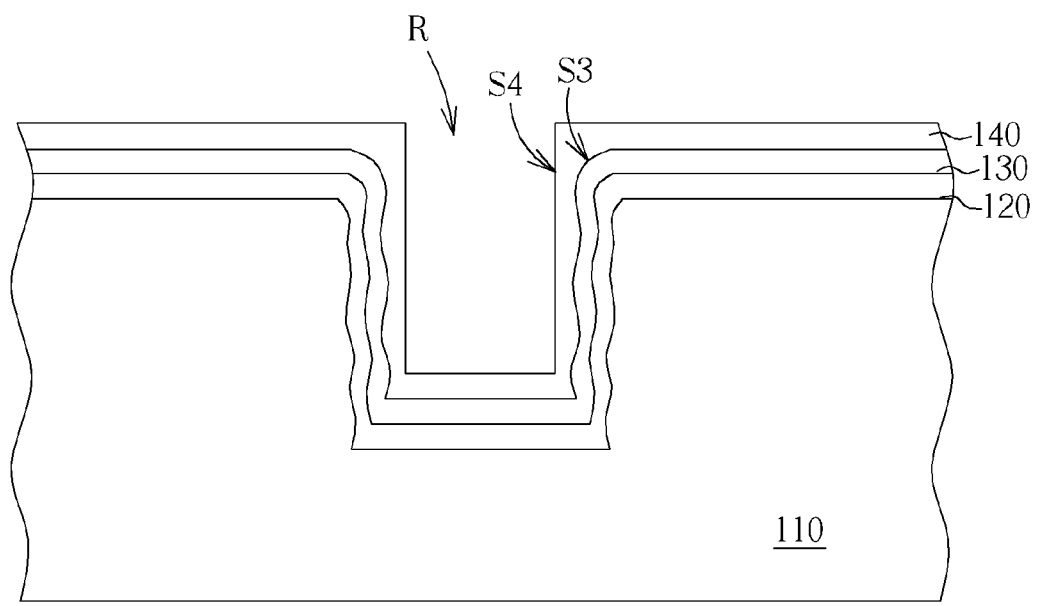

As shown in FIG. 3, a buffer layer 140 is formed on the barrier layer 130. The thickness of the buffer layer 140 may be about 2~100 nm. The buffer layer 140 includes Cobalt (Co) or Ruthenium (Ru) etc. In a preferred embodiment, the buffer layer 140 is formed by a Chemical Vapor Deposition (CVD) process. This way, due to the capability of step coverage of Chemical Vapor Deposition (CVD) processes being better than the capability of step coverage of Physical Vapor Deposition (PVD) processes, the smoothness of the top surface of the buffer layer 140 will be different from the smoothness of the bottom surface of the buffer layer 140, so that the buffer layer 140 formed by the process has a top surface S4, that is a smooth surface. The top surface S4 is smoother than the rough surfaces S3 between the buffer layer 140 and the barrier layer 130. In a preferred case, the processing temperature of the Chemical Vapor Deposition (CVD) process is in a range comprised between 150° C. and 850° C. In a still preferred case, the processing temperature of the Chemical Vapor Deposition (CVD) process is between 250° C. and 275° C. At this processing temperature, the buffer layer 140 has a better quality in accordance with experimental data. In one case, the difference in the highest point and the lowest point of the rough surfaces S3 may approach 10~100 nm. Generally, the difference in the highest point and the lowest point of the rough surfaces S3 approaches 50~60 nm. Moreover, by applying the buffer layer 140 of the present invention, the difference in the highest point and the lowest point of the top surface S4 can be 10%~70% of the difference in the highest point and the lowest point of the rough surfaces S3, but it is not limited thereto, depending upon the thickness of the buffer layer 140.

Figure 4:
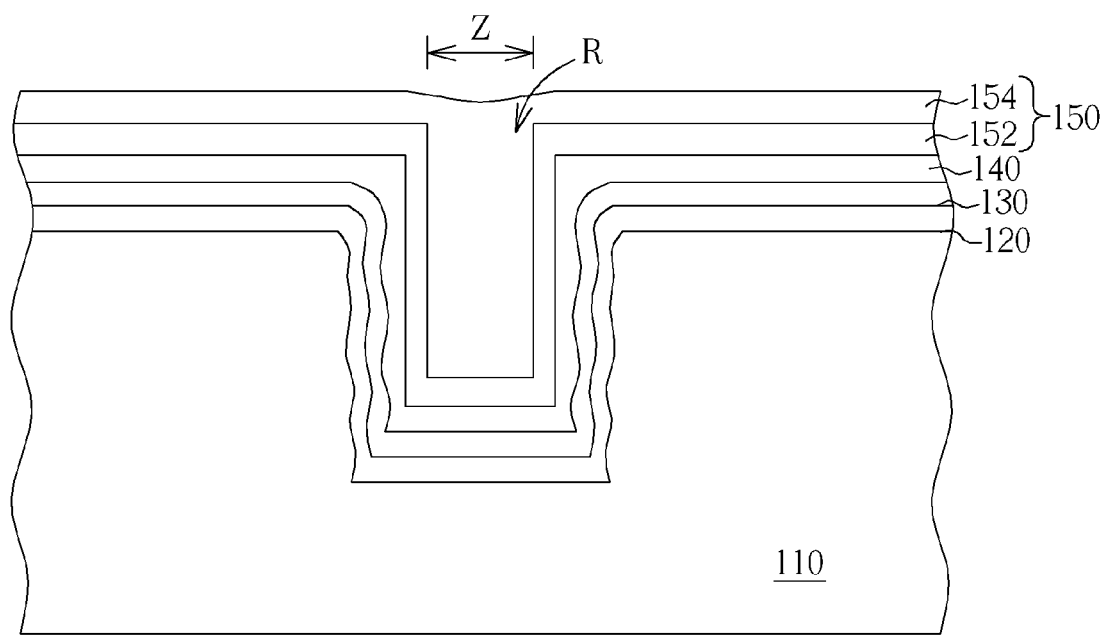

As shown in FIG. 4, a seed layer 152 may be selectively formed on the buffer layer 140. Then, a main conductive layer 154 is formed on the seed layer 152. Therefore, a conductive layer 150 including the seed layer 152 and the main conductive layer 154 is formed. The conductive layer 150 may be formed with Copper (Cu). The seed layer 152 may be formed through a physical vapor deposition (PVD) process to serve as an adhesive layer for the main conductive layer 154. Thus, the conductive layer 154 may be formed on the seed layer 152 by methods such as electroplating. As shown in the figure, thanks to the buffer layer 140 of the present invention having a smooth top surface S4, the seed layer 152 formed thereon also has a smooth surface, thereby improving the structural and electrical performances of the main conductive layer 154 formed on the seed layer 152, and improving the performances of step coverage of the seed layer 152 and the conductive layer 154 as well.

The buffer layer 140 is preferred to be composed of Cobalt (Co) or Ruthenium (Ru). Thus, the through silicon via structure formed by the buffer layer 140 of the present invention can be more thermal resistive and avoid thermal cracks, and the buffer layer 140 of the present invention provides the seed layer 152 a better adhesivity. Moreover, thanks to the seed layer 152 having a better adhesivity, the thickness of the seed layer 152 can be reduced, thereby decreasing the processing time and cost and increasing the remaining opening size Z of the recess R, which enables the main conductive layer 154 to be easier to fill into the recess R and prevents voids from being generated. Moreover, as the buffer layer 140 is composed of Ruthenium (Ru), the seed layer 152 does not need to be formed, and the main conductive layer 154 is therefore directly formed on the buffer layer 140. By doing this, the processing time and cost of the present invention decrease, and the remaining opening size Z of the recess R increases, thereby enabling the main conductive layer 154 to be easier to fill into the recess R.

Figure 5:
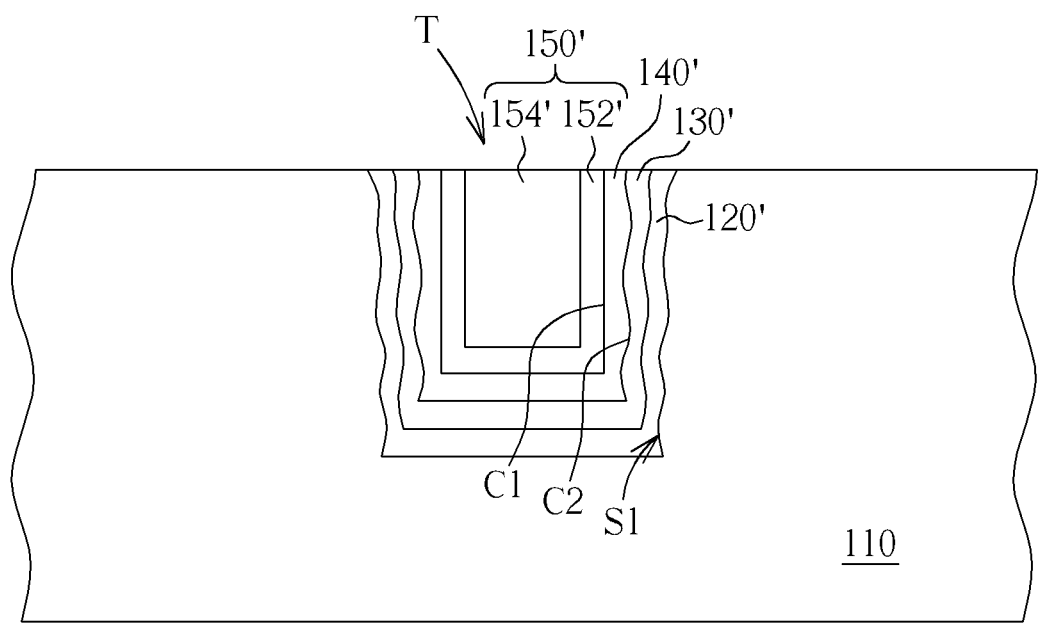

The conductive layer 150, the buffer layer 140, the barrier layer 130 and the liner 120 are planarized. As shown in FIG. 5, a through silicon via (TSV) structure T is formed. In details, the through silicon via structure T includes a stacked structure and the stacked structure includes a liner 120', a barrier layer 130', a buffer layer 140', a seed layer 152' and a main conductive layer 154' from bottom to top, wherein the seed layer 152' and the main conductive layer 154' constitute a conductive layer 150'. The contact surface C1 between the conductive layer 150' and the buffer layer 140' is smoother than the contact surface C2 between the barrier layer 130' and the buffer layer 140'. The liner 120' and the seed layer 152' can be selectively formed depending upon the need.

The through silicon via (TSV) structure and the process thereof of the present invention can be applied to various through silicon via processes, such as a via first process or a via last process etc. For instance, the via first process may be divided into two kinds that form the through silicon via structures before or after the MOS transistors are formed. There are four embodiments applying the through silicon via (TSV) structure and various through silicon via processes, but the applications of the present invention are not restricted to these embodiments.

Figure 6:
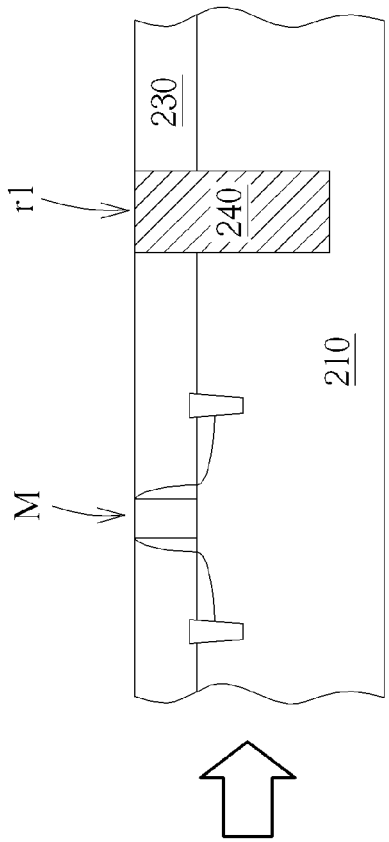
FIG. 6 schematically depicts a cross-sectional view of a through silicon via process according to an embodiment of the present invention.
Figure 6:
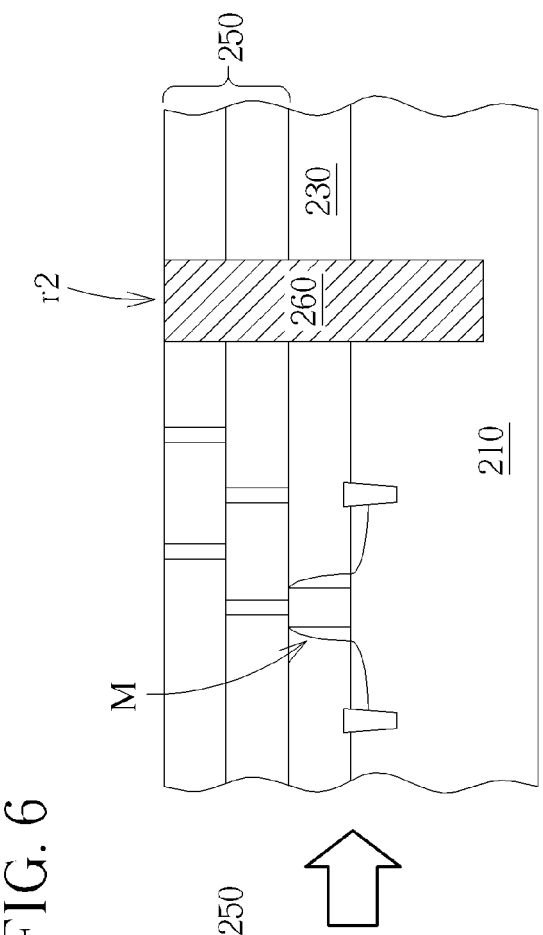

As shown in FIG. 6, a flow of a via first process after MOS transistors are formed and before metal interconnects are formed includes the following steps. A MOS transistor M is formed on a substrate 210 (as shown in the left diagram), and an interdielectric layer 230 is formed; then, a recess r1 is formed in the interdielectric layer 230 and the substrate 210, and a conductive metal 240 is filled (as shown in the right diagram). Thereafter, metal interconnects are formed and the substrate 210 is thinned down from the back side until the conductive metal 240 is exposed.

Figure 7:
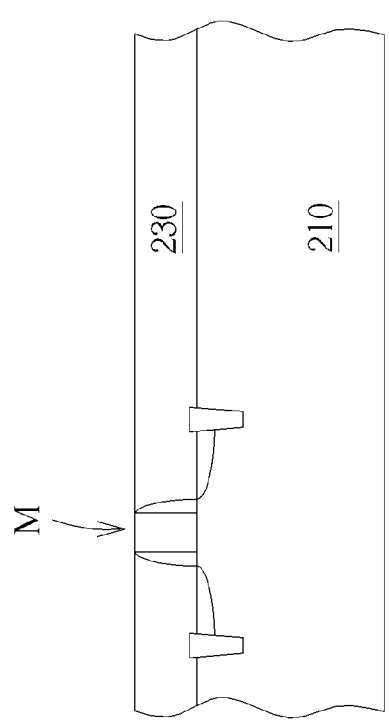
FIG. 7 schematically depicts a cross-sectional view of a through silicon via process according to an embodiment of the present invention.
Figure 7:
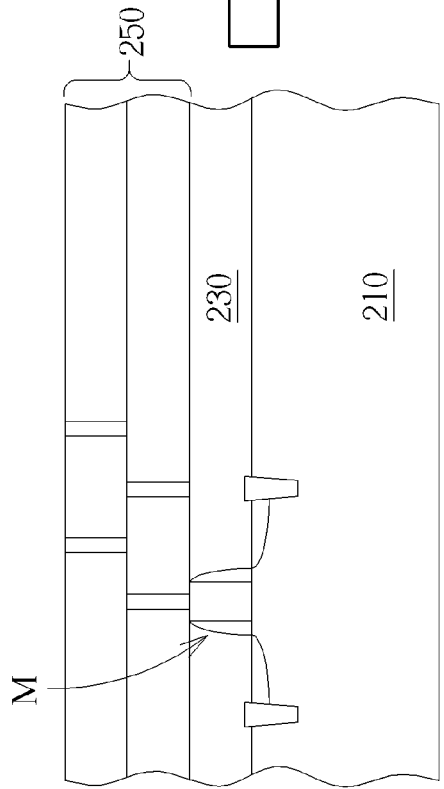

As shown in FIG. 7, a flow of a via last process after metal interconnects are formed includes the following steps. A MOS transistor M is formed on a substrate 210 (as shown in the left diagram), and an interdielectric layer 230 and a multilayer interconnect structure 250 are formed; then, a recess r2 is formed in the multilayer interconnect structure 250, the interdielectric layer 230 and the substrate 210 from the front side of the substrate 210, and a conductive metal 260 is filled (as shown in the right diagram).

Figure 8:
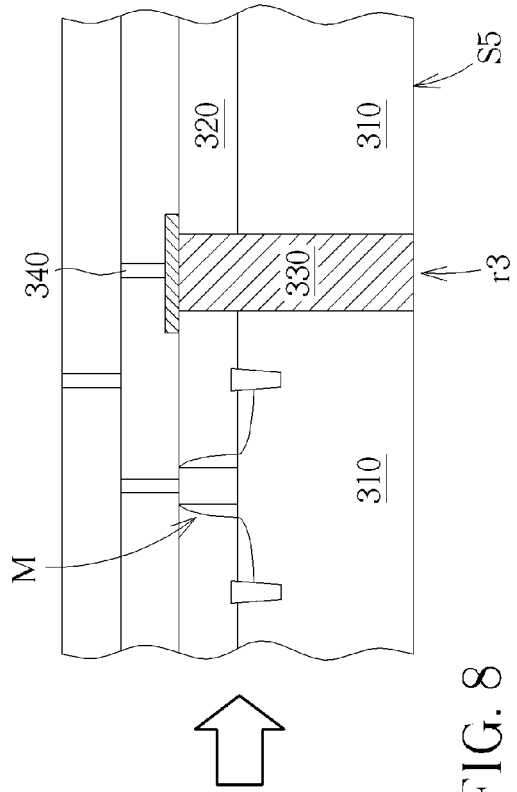
FIG. 8 schematically depicts a cross-sectional view of a through silicon via process according to an embodiment of the present invention.

As shown in FIG. 8, a flow of a via last process after MOS transistors are formed and before metal interconnects are formed includes the following steps. The fabrication of semiconductor structures such as a MOS transistor M on a substrate 310 is finished (as shown in the left diagram); a multilayer interconnect structure 340 is formed, the substrate 310 is thinned down, a recess r3 through the substrate 310 and an interdielectric layer 320 is formed from a back side S5 of the substrate 310, and a conductive metal 330 is filled to connect metals such as the multilayer interconnect structure 340 (as shown in the right diagram).

Figure 9:
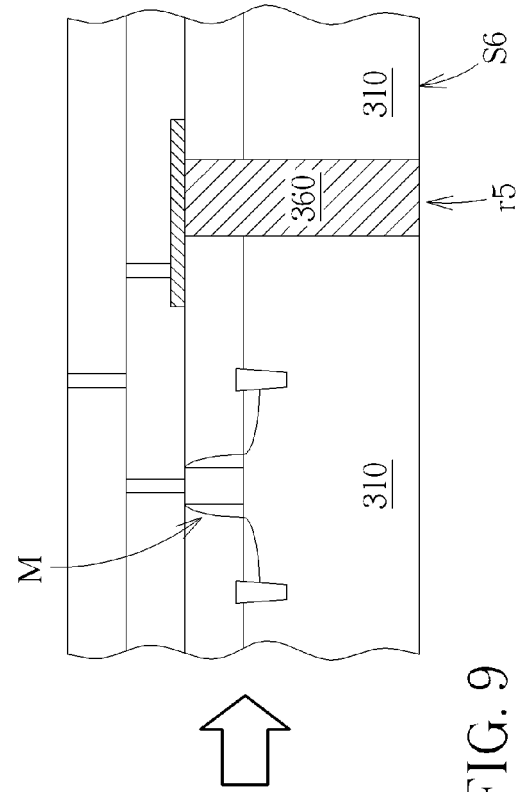
FIG. 9 schematically depicts a cross-sectional view of a through silicon via process according to an embodiment of the present invention.

As shown in FIG. 9, a flow of a via first process before MOS transistors are formed includes the following steps. A recess r4 is formed in a substrate 310 and an insulating material 350 such as oxide is filled, and a MOS transistor M is formed (as shown in the left diagram); the fabrication of semiconductor structures such as MOS transistors and multilayer interconnect structures are finished. Then, the substrate 310 is thinned down from a back side S6 until the insulating material 350 is exposed. Thereafter, the insulating material 350 is removed and replaced by a conductive metal 360 (as shown in the right diagram).

The recesses r1, r2, r3, r5 in said through silicon via processes all have rough surfaces, therefore a liner may be selectively formed; a barrier layer is formed; a buffer layer with a smooth top surface is formed; a seed layer may be selectively formed or etc. before the conductive metals 240/260/330/360 are formed. This way, the through silicon via structure and process thereof of the present invention can be applied into processes to achieve said superiorities.

To summarize, the present invention provides a through silicon via structure and a process thereof, which forms a buffer layer between the barrier layer and the conductive layer, so that problems of rough surface of material layers such as a seed layer formed on the rough surface of the recess can be solved. Therefore, the performances of a step coverage of the material layers can be improved. That is, the contact surface between the conductive layer and the buffer layer is smoother than the contact surface between the barrier layer and the buffer layer. Moreover, the through silicon via structure formed by the buffer layer of the present invention is more thermal resistive and thermal cracks can be avoided, and the buffer layer of the present invention enables the seed layer to have better adhesivity, so that the thickness of the seed layer can be reduced, and the processing time and cost are therefore reduced. Thus, the remaining opening size of the recess increases, thereby enabling the main conductive layer to be easier to fill into the recess, which avoids voids generation. Moreover, the buffer layer is preferred to be composed of Cobalt (Co) or Ruthenium (Ru) etc, and the buffer layer is preferred to be formed through a Chemical Vapor Deposition (CVD) process, but it is not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A through silicon via structure located in a recess of a substrate, comprising:
    a barrier layer covering the surface of the recess;
    a buffer layer having a top surface with different smoothness from a bottom surface covering the barrier layer; and
    a conductive layer located on the buffer layer and filling the recess, thereby constituting a through silicon via structure, wherein the contact surface between the conductive layer and the buffer layer is smoother than the contact surface between the barrier layer and the buffer layer.

2. The through silicon via structure according to claim 1, wherein the barrier layer comprises a titanium nitride layer or a tantalum nitride layer.

3. The through silicon via structure according to claim 1, further comprising:
    a liner located between the barrier layer and the substrate.

4. The through silicon via structure according to claim 3, wherein the liner comprises an oxide layer.

5. The through silicon via structure according to claim 1, wherein the buffer layer comprises Cobalt (Co) or Ruthenium (Ru).

6. The through silicon via structure according to claim 1, wherein the conductive layer comprises a seed layer located on the buffer layer, and a main conductive layer located on the seed layer.

7. The through silicon via structure according to claim 1, wherein the conductive layer comprises Copper (Cu).

8. The through silicon via structure according to claim 1, wherein the depth/diameter ratio of the recess is larger than 10.

* * * * *